United States Patent
Bratt et al.

(10) Patent No.: US 7,502,978 B2
(45) Date of Patent: Mar. 10, 2009

(54) SYSTEMS AND METHODS FOR RECONFIGURING SCAN CHAINS

(75) Inventors: John Bratt, Fort Collins, CO (US); Jeffrey Rearick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 412 days.

(21) Appl. No.: 11/314,570

(22) Filed: Dec. 21, 2005

(65) Prior Publication Data

US 2006/0150040 A1    Jul. 6, 2006

(51) Int. Cl.
*G01R 31/28* (2006.01)

(52) U.S. Cl. .................................. 714/726

(58) Field of Classification Search ............ 714/724, 714/726, 729, 733–734, 30, 718, 727; 365/200, 365/201; 716/4
See application file for complete search history.

(56) References Cited

U.S. PATENT DOCUMENTS

| | | | | |
|---|---|---|---|---|
| 6,114,892 A | * | 9/2000 | Jin | 327/202 |
| 6,131,173 A | * | 10/2000 | Meirlevede et al. | 714/726 |
| 6,434,733 B1 | * | 8/2002 | Duggirala et al. | 716/11 |
| 7,127,695 B2 | * | 10/2006 | Huang et al. | 716/10 |

* cited by examiner

*Primary Examiner*—Phung M Chung

(57) ABSTRACT

Systems and methods for reconfiguring scan chains are provided. A representative system incorporates a first scan chain of flip-flops operative in either a normal mode or a rotate mode such that, if the first scan chain is operative in the normal mode, inputs are provided to the flip-flops in sequential order with a first of the flip-flops receiving an input prior to a second of the flip-flops, and, if the first scan chain is operative in the rotate mode, inputs are provided to the flip-flops with the first of the flip-flops receiving an input subsequent to the second of the flip-flops.

12 Claims, 6 Drawing Sheets

NORMAL MODE
(EQUIVALENT CONNECTIVITY)

ROTATE MODE
(EQUIVALENT CONNECTIVITY)

| FOLD | ROTATE | RESULT | OUTPUT OF FIG. 9 |
|---|---|---|---|
| NO | NO | SINGLE, LONG SCAN CHAIN | 1,2,3,4,5,6,7,8 |
| NO | YES | LONG SCAN CHAIN WITH REORDERED OUTPUT | 1,2,3,4,8,5,6,7 |
| YES | NO | MULTIPLE, SHORT SCAN CHAINS | 1,2,3,4 AND 5,6,7,8 |
| YES | YES | MULTIPLE, SHORT SCAN CHAINS WITH REORDERED OUTPUTS | 1,2,3,4 AND 8,5,6,7 |

SYSTEMS AND METHODS FOR RECONFIGURING SCAN CHAINS

CROSS REFERENCE TO RELATED APPLICATION

This application is a utility application that claims the benefit of and priority to U.S. Provisional patent application Ser. No. 60/638,071, which was filed on Dec. 21, 2004, and which is incorporated herein by reference.

BACKGROUND

The cost of testing an integrated circuit (IC) during manufacture is proportional to the length of the tests used. That is, the cost is proportional to the number of tester cycles used to apply test patterns to the IC. The length of the test patterns applied to a scan-testable circuit, i.e., an IC in which flip-flops can be arranged into one or more serial scan chains, is a function of the length of those scan chains. For example, the longer the scan chains, the more tester cycles are required to fill them with stimulus data and to unload response data.

One solution used to reduce the length of test patterns is to use shorter scan chains, e.g., the scan chains depicted in FIG. 1. Unfortunately, the use of shorter scan chains results in an increase in the number of scan chains used. This can be problematic because each scan chain typically requires its own data input pins, e.g., SCAN $IN_0$ through SCAN $IN_n$, and data output pins, e.g., SCAN $OUT_0$ through SCAN $OUT_n$. Given that ICs have limited numbers of pins, restrictions are placed on the number of scan chains that can be used. Thus, the degree of parallelism of scan chains that can be employed to reduce test costs also is restricted.

A technique for reducing the number of pins used for multiple scan chains involves several of the scan chains sharing a single data input pin. As shown in the example of FIG. 2, scan chains $0_0$ through $N_0$ receive input data from the SCAN IN pin. This configuration provides the same data to flip-flops that occupy the same relative positions. For instance, flip-flops $0_0, 1_0 \ldots N_0$ receive the same data. The data outputs of the scan chains also may be compressed, such as by using a multiple input signal register (MISR). The above technique is known in the literature as the "Illinois scan" technique.

As noted above, the sharing of scan input data among multiple scan chains results in the "nth" flip-flop of each of the parallel scan chains having the same data bit. This can impose undue restrictions on the variety of data patterns that can be loaded into the IC and may reduce fault coverage.

SUMMARY

Systems and methods for reconfiguring scan chains are provided. A representative embodiment of such a system comprises a first scan chain of flip-flops operative in either a normal mode or a rotate mode such that, if the first scan chain is operative in the normal mode, inputs are provided to the flip-flops in sequential order with a first of the flip-flops receiving an input prior to a second of the flip-flops, and, if the first scan chain is operative in the rotate mode, inputs are provided to the flip-flops with the first of the flip-flops receiving an input subsequent to the second of the flip-flops.

A representative embodiment of a method for reconfiguring scan chains comprises: providing an integrated circuit having a first scan chain and a second scan chain operative in parallel such that flip-flops of the first scan chain and the second scan chain that occupy corresponding data positions contain identical scan input data; and selectively reconfiguring the second scan chain such that flip-flops of the first scan chain and the second scan chain that occupy corresponding data positions do not contain identical scan input data.

Another representative embodiment of a method for reconfiguring scan chains comprises: providing a first scan chain of flip-flops; determining whether the first scan chain is to be operated in either a normal mode or a rotate mode; providing inputs to the flip-flops in sequential order such that a first of the flip-flops receives an input prior to a second of the flip-flops if it is determined that the first scan chain is to operate in the normal mode; and providing inputs to the flip-flops such that the first of the flip-flops receives an input subsequent to the second of the flip-flops if it is determined that the first scan chain is to operate in the rotate mode.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

As will be described in detail here, systems and methods for reconfiguring scan chains involve the use of parallel scan chains that can receive data from a common scan input pin. This is accomplished while enabling the bits of data of one of the scan chains to be arranged in a different order than that of another scan chain. Specifically, bits of data which would typically occupy relative "nth" positions in their respective scan chains and which would normally receive identical scan input data would, after being reconfigured, occupy different relative positions. Therefore, at least the "nth" position flip-flops of each scan chain could be loaded with different data values while sharing the same scan input pin.

Figure 1:
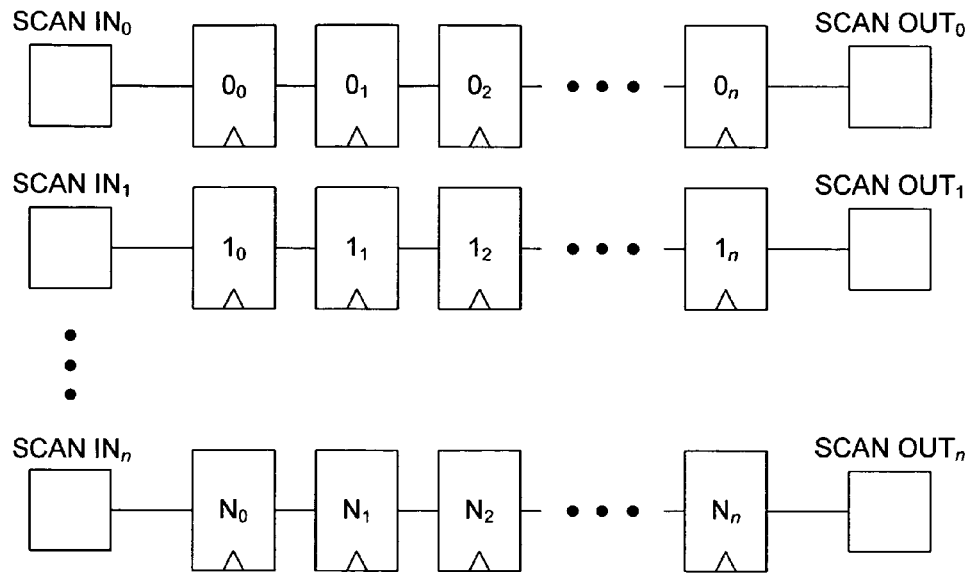
FIG. 1 is a schematic diagram of several scan chains of a prior art integrated circuit.
Figure 2:
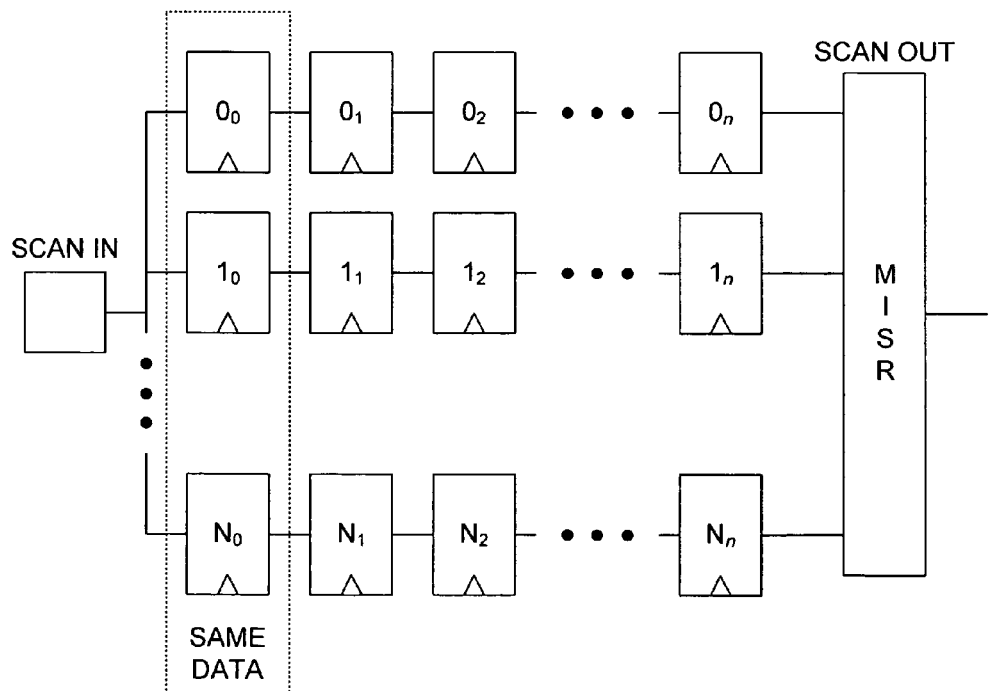
FIG. 2 is a schematic diagram depicting several scan chains of another prior art integrated circuit.
Figure 3:
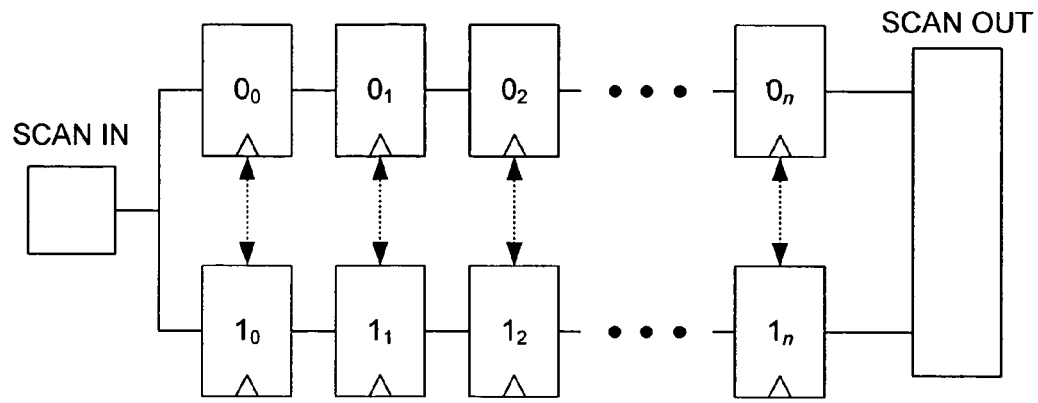
FIG. 3 is a schematic diagram of a portion of an embodiment of an integrated circuit, with the flip-flops of the scan chains depicted operating in a normal mode.

FIG. 3 is a schematic diagram depicting two parallel scan chains of an integrated circuit (IC) that use a common scan input pin. As indicated by the dashed, double-arrowed lines, the data on flip-flop ($0_0$) is the same as the data on flip-flop ($1_0$), the data on flip-flip ($0_1$) is the same as the data on flip-flip ($1_1$), and so forth. Note that various scan out techniques can be used, such as using a multiple input signal register (MISR) or exclusive "OR" (X-OR) tree, among others.

Problematically, if a component is connected between flip-flops that occupy the same relative positions, e.g., flip-flops ($0_0$) and ($1_0$), such a component may not be able to be properly tested. By way of example, if the component is an AND gate, the output of the AND gate cannot be tested with inputs of 0,1 or 1,0. This is because the flip-flops provide the same data to the component, i.e., 0,0 or 1,1. Note that operation of the scan chains depicted in FIG. 3 is attributable to a normal mode of operation. A rotate mode of operation of the scan chains will now be described with respect to FIG. 4.

Figure 4:
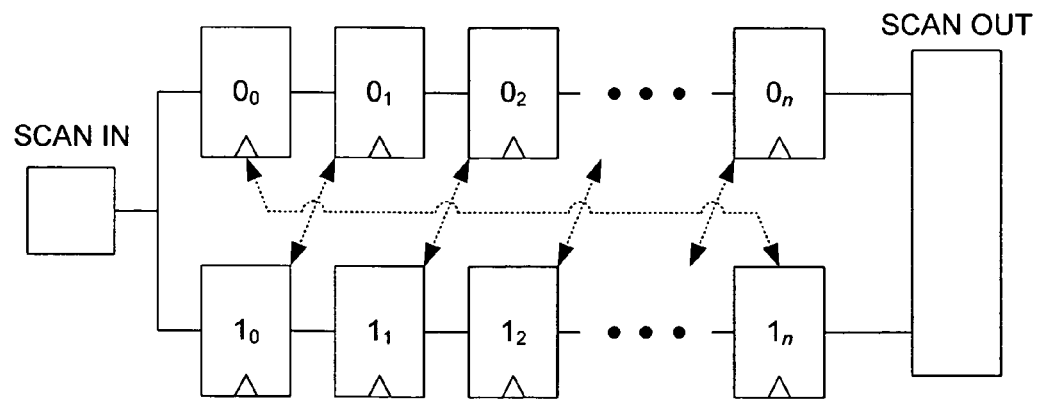
FIG. 4 is a schematic diagram of the portion of the integrated circuit of FIG. 3, with the flip-flops shown operating in a rotate mode.

As shown in FIG. 4, the parallel scan chains of FIG. 3 have been reconfigured such that the flip-flops occupying the same relative positions receive different data. Specifically, the flip-flop ($1_n$) is reconfigured to occupy the data location previously occupied by flip-flop ($1_0$), with the remaining flip-flops of scan chain (1) being virtually shifted to the right as indicated. Thus, flip-flops ($0_0$) and ($1_n$) receive the same data, flip-flips ($0_1$) and ($1_0$) receive the same data, and so forth, as indicated by the dashed, double-arrowed lines. Note that this results in the first flip-flops of the scan chains, i.e., flip-flop ($0_0$) and flip-flop ($1_0$), not receiving the same data.

During testing of an IC that includes scan chains such as depicted in FIGS. 3 and 4, test patterns can be applied to the IC in at least two passes. For instance, one pass can be applied with the scan chains in the normal mode. This tests the IC under a first set of constraints. One or more of the scan chains then can be operated in the rotate mode with test patterns being applied to impose a second set of constraints on the IC. This potentially enables high quality test to be created that can be applied in a relatively small number of test cycles, since relatively short scan chains are still being used.

Figure 5:
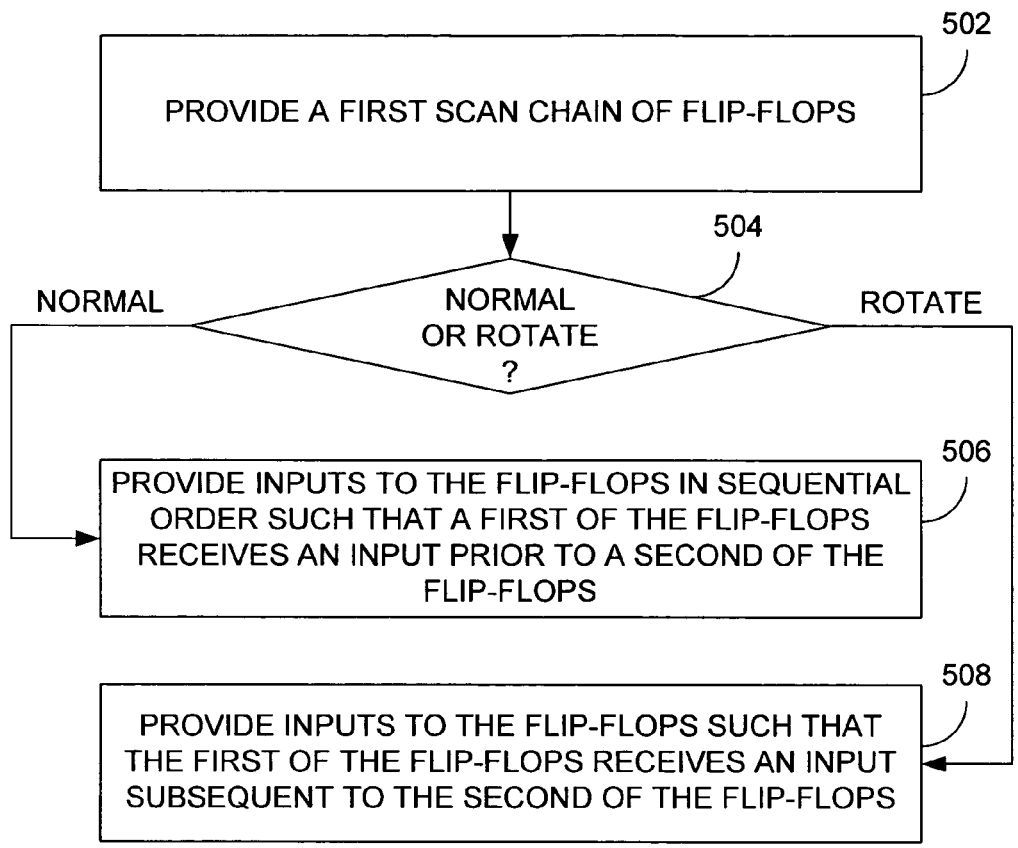
FIG. 5 is a flowchart depicting an embodiment of a method for reconfiguring scan chains.

FIG. 5 is a flowchart depicting a method for reconfiguring scan chains. As shown in the embodiment of FIG. 5, the method may be construed as beginning at block 502, where a first scan chain of flip-flops is provided. In block 504, a determination is made as to whether the first scan chain is to be operated in a normal mode or a rotate mode. If it is determined in block 504 that the scan chain is to operate in a normal mode, inputs can be provided to the flip-flops in sequential order so that a first of the flip-flops receives an input prior to a second of the flip-flops. If, however, the first scan chain is to operate in a rotate mode, the process may proceed to block 508, where inputs are provided to the flip-flops so that the first of the flip-flops receives an input subsequent to the second of the flip-flops.

Figure 6:
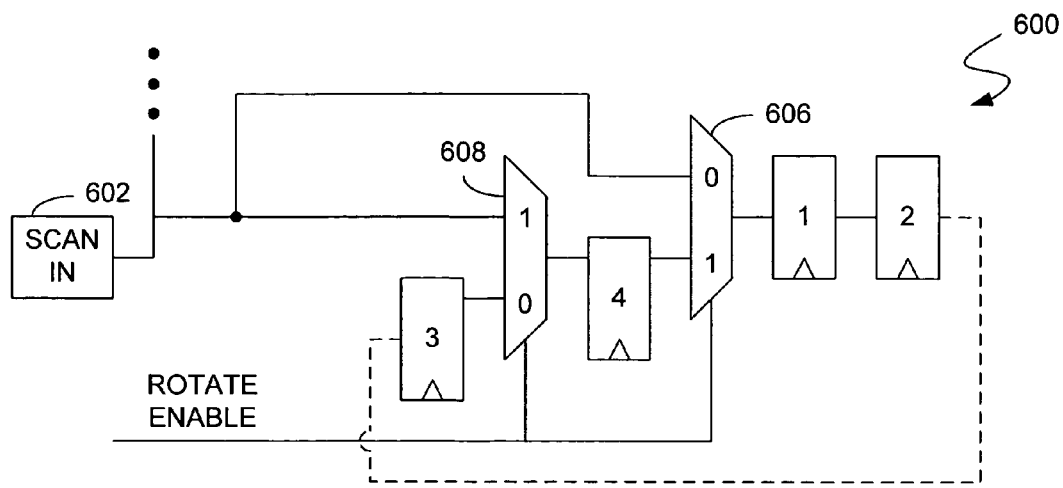
FIG. 6 is a schematic diagram depicting an embodiment of a scan chain that can operate in both a normal mode and a rotate mode.

FIG. 6 is a schematic diagram depicting an embodiment of an IC that includes a scan chain that can operate in either a normal mode or a rotate mode. Note in FIG. 6 that only one segment of one scan chain is shown, with that segment including only 4 flip-flops. Clearly, various numbers of scan chains, each having various numbers of flip-flips, can be used.

As shown in FIG. 6, scan chain 600 receives an input from a scan input 602 which, as depicted, also can provide input to one or more other scan chains (none of which are shown in FIG. 6). Scan input data is provided to multiplexors 606 and 608. The output of multiplexor 606 is provided to flip-flops 1 and 2, with the output of flip-flop 2 being provided to flip-flop 3. The output of flip-flop 3 is provided as one of the inputs to a multiplexor 608. The output of multiplexor 608 is provided to flip-flop number 4, the output of which is provided as the other input to multiplexor 606. A rotate enable signal line is attached to each of the multiplexors for switching operation of the scan chain between the normal and rotate modes. Not shown in FIG. 6 is another multiplexor in front of the scan output pin.

Figure 7:
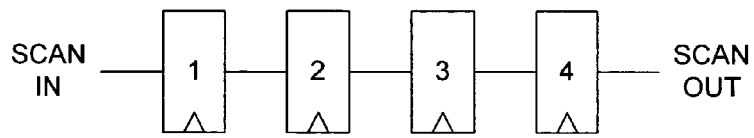
FIG. 7 is a schematic diagram of the scan chain of FIG. 6, showing an equivalent functional layout of the scan chain when operating in the normal mode.

In the normal mode of operation, i.e., when the rotate enable line is not enabled, the scan input signal is provided to multiplexor 606 and passed to flip-flops 1, 2 and then 3. The signal is then provided to multiplexor 608 and subsequently to flip-flop 4. Therefore, the equivalent connectivity displayed by scan chain 600 when operating in the normal mode is as depicted in FIG. 7. Specifically, flip-flops 1, 2, 3 and 4 receive scan input data in sequential order. The scan output pin is driven by a multiplexor (not shown) which selects the output of flip-flop 4 in normal mode.

Figure 8:
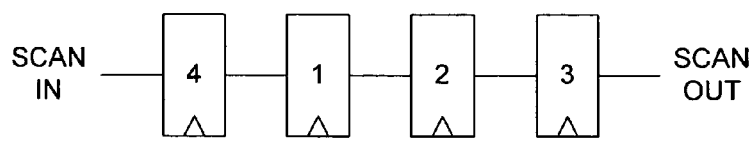
FIG. 8 is a schematic diagram of the scan chain of FIG. 6, showing an equivalent functional layout of the scan chain when operating in the rotate mode.

When operating in the rotate mode, i.e., the rotate enable line is enabled, the scan input signal is provided to multiplexor 604 then to multiplexor 608, which provides the signal to flip-flop 4. From flip-flop 4, the signal is provided to multiplexor 606 and then flip-flops 1, 2 and 3, as described before. Therefore, the equivalent connectivity of scan chain 600 when operated in the rotate mode is as depicted in FIG. 8, whereas the scan output pin selects the output of flip-flop 3 in rotate mode. Specifically, the "nth" flip-flop, in this case flip-flop number 4, receives scan input data before the other flip-flops of the scan chain. Note that although in the example embodiment of FIG. 6 only one flip-flop has been reordered with respect to the others, in various other embodiments, the relative positions of various other numbers of flip-flops can be changed.

Figures 9, 10:
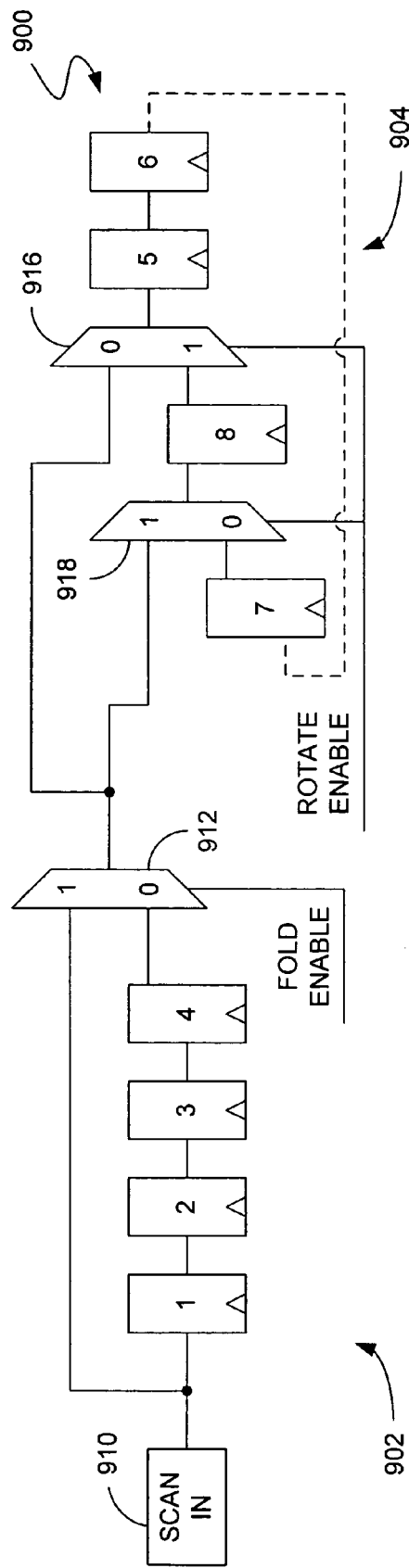
FIG. 9 is a schematic diagram depicting another embodiment of a scan chain.
FIG. 10 is a table indicating operational results associated with fold and rotate operations of scan chains.

Another embodiment of a scan chain is depicted schematically in FIG. 9. In the embodiment of FIG. 9, two scan segments are shown. Specifically, scan chain 900 includes a first scan segment 902 and a second scan segment 904, each of which includes four flip-flops. In particular, scan chain segment 902 includes flip-flops 1, 2, 3 and 4, and scan chain segment 904 includes flip-flops 5, 6, 7 and 8. Note that although only one scan chain is depicted, various other embodiments could be arranged in parallel as described before.

Scan input 910 is electrically connected to flip-flop 1, which is connected to flip-flop 2, flip-flop 2 is connected to flip-flop 3, and flip-flop 3 is connected to flip-flop 4. Flip-flip 4 provides its output to a multiplexor 912. Scan input 910 also provides an input to multiplexor 912, with the output of multiplexor 912 being provided as an input to multiplexor 918. A fold enable line also is connected to multiplexor 912 so that when the fold enable line is enabled, the scan input is provided to multiplexors 916 and 918. However, when the fold enable line is not enabled, the output of the scan registers 1, 2, 3 and 4 is provided to multiplexors 916 and 918. The output of multiplexor 912 also is provided as an input to multiplexor 916.

Scan chain segment 904 also includes a multiplexor 918 that receives an input from the output of multiplexor 912 and an input from flip-flop 7. The output of multiplexor 918 is provided as an input to flip-flop 8, the output of which is provided as an input to multiplexor 916. The output of flip-flop 916 is provided as an input to flip-flop 5, which provides its output to flip-flop 6, which in turn provides its output to flip-flop 7. Rotate enable lines are provided to each of the multiplexors 916 and 918. Thus, when the rotate enable lines are enabled, output of multiplexor 912 of the first scan chain segment 902 is provided at the output of multiplexor 916. The output of multiplexor 912 also is provided as an output by multiplexor 918 and provided to flip-flop 8. Output of flip-flop 8 then is provided to flip-flops 5, 6 and 7. When the rotate enable line is not enabled, the flip-flops receive the data in sequential order, i.e., flip-flop 5, then flip-flop 6, then flip-flop 7, then flip-flop 8.

As can be shown by the embodiment of FIG. 9, when the fold enable line is enabled, the scan chain 900 is reconfigured with scan segments 902 and 904 being in parallel, resulting in multiple shorter scan chains. However, when the fold enable line is not enabled, a single scan chain is provided.

Note, the various combinations of fold and rotate functionality are depicted in the table shown in FIG. 10. Specifically, when fold and rotate are both disabled, a single, long scan chain is provided. With respect to the output of the embodiment depicted in FIG. 9, flip-flops 1-8 receive scan input in sequential order. When fold is disabled and rotate is enabled, a long scan chain with reordered output is provided. Specifically, scan input is provided to flip-flops 1-4, then flip-flop 8 and then flip-flops 5, 6, and 7. When fold is enabled and rotate is not enabled, multiple short scan chains are provided. Thus, the outputs of the embodiment of FIG. 9 are from flip-flops 1, 2, 3 and 4 in sequential order, and separately from flip-flops 5, 6, 7, and 8 in sequential order. When both fold and rotate are enabled, multiple short scan chains with reordered outputs are provided. Thus, with respect to FIG. 9, the outputs are flip-flops 1, 2, 3 and 4 sequentially and flip-flops 8, 5, 6 and 7.

Figure 11:
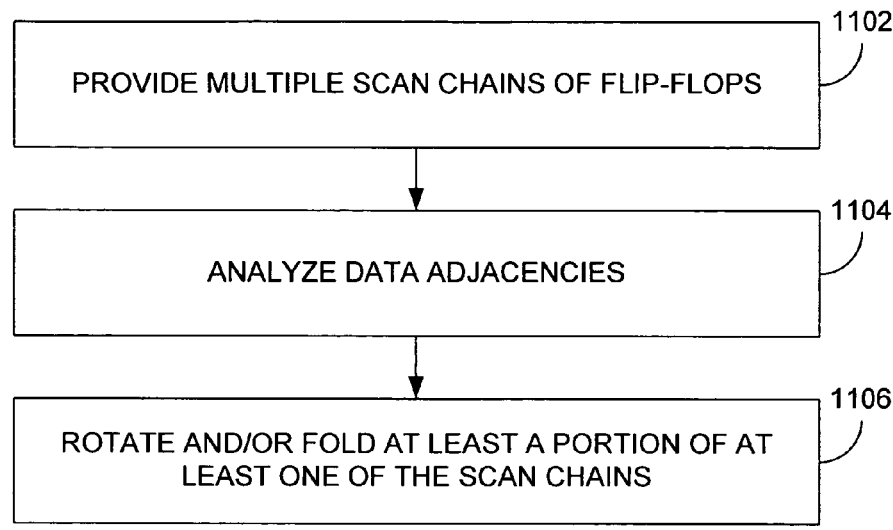
FIG. 11 is a flowchart depicting functionality of an embodiment of a scan chain operating system.

Another embodiment of a method for reconfiguring scan chains is depicted in the flowchart of FIG. 11. As shown in FIG. 11, the method may be construed as beginning at block 1102, where multiple scan chains of flip-flops are provided. In block 1104, data adjacencies are analyzed. Specifically, a determination is made as to whether the testing of one more components of an integrated circuit that includes the scan chains requires the reconfiguring of data of one or more scan chains of the integrated circuit. In block 1106, at least a portion of at least one of the scan chains is rotated and/or folded as required to implement the required test.

Note that the functionality associated with embodiments of methods for reconfiguring scan chains can be embodied in systems that are implemented in software, hardware and/or combinations thereof. When implemented in hardware, embodiments of the systems can be implemented with one or a combination of various technologies. By way of example, the following technologies, which are each well known in the art, can be used: a discrete logic circuit(s) having logic gates for implementing logic functions upon data signals, an application specific integrated circuit(s) (ASIC) having appropriate combinational logic gates, a programmable gate array(s) (PGA), and a field programmable gate array(s) (FPGA).

When implemented in software, embodiments of such a system can be stored on any computer-readable medium for use by or in connection with any computer-related system. In the context of this document, a computer-readable medium is an electronic, magnetic, optical, or other physical device or means that can contain or store a computer program for use by or in connection with a computer-related system. For example, a computer-readable medium can be any means that can store, communicate, propagate, or transport a computer program for use by or in connection with an instruction execution system, apparatus or device. The computer-readable medium can be, for example but not limited to, an electronic, magnetic, optical, electromagnetic, infrared, or semiconductor system, apparatus, device or propagation medium.

Figure 12:
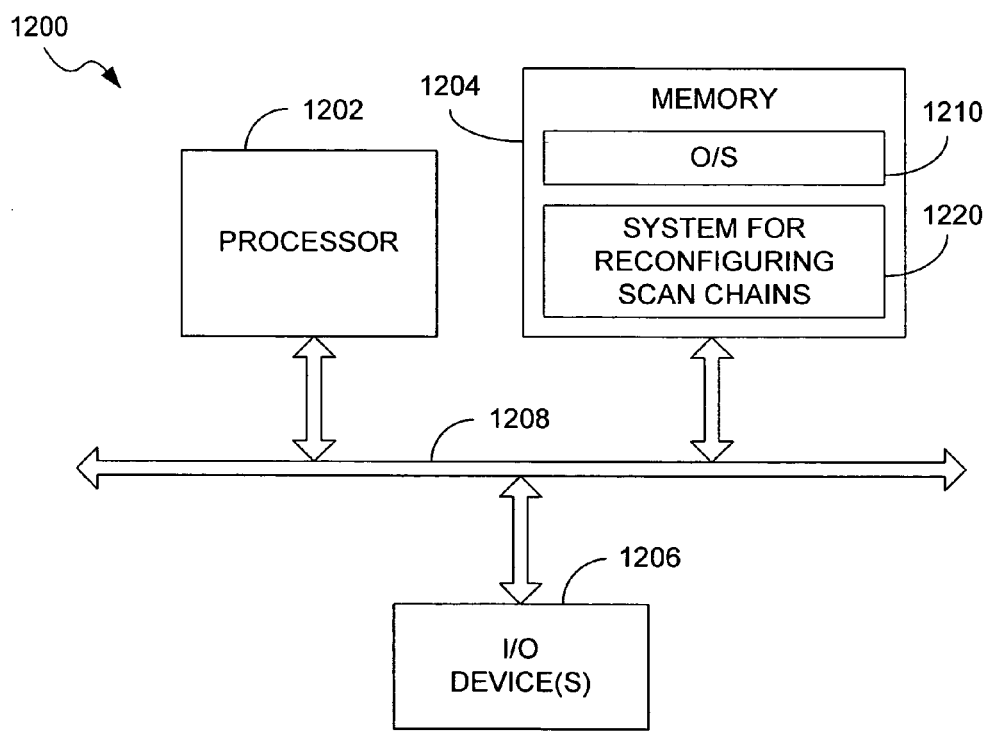
FIG. 12 is a schematic diagram of a computer or processor-based device that can be used for implementing the scan chain operating system of FIG. 11.

An embodiment of a system for designing ICs that is implemented in software is depicted schematically in FIG. 12, where the system is associated with a computer or processor-based system 1200. Generally, computer 1200 includes a processor 1202, memory 1204, and one or more input and/or output (I/O) devices 1206 (or peripherals) that are communicatively coupled via a local interface 1208. The software in memory 1204 can include one or more separate programs, each of which comprises an ordered listing of executable instructions for implementing logical functions. In the example of FIG. 12, the software in the memory 1204 includes an operating system (O/S) 1210 and system for reconfiguring scan chains 1220.

The system for reconfiguring scan chains 1220 includes executable instructions that can be executed by the processor for carrying out the desired functionality, such as that described above with respect to FIG. 11. Note that the system 1200 can include or be a portion of automatic test equipment (ATE) that can be used to test an IC. Thus, in some embodiments, such an ATE can be used to provide appropriate inputs for testing an IC, e.g., scan inputs, rotate enable and/or fold enable signals.

It should be emphasized that many variations and modifications may be made to the above-described embodiments. All such modifications and variations are intended to be included herein within the scope of this disclosure and protected by the following claims.

The invention claimed is:

1. A method for reconfiguring a scan chain, comprising:
providing a first scan chain of flip-flops;
determining whether the first scan chain is to be operated in either a normal mode or a rotate mode;
providing inputs to the flip-flops in sequential order such that a first of the flip-flops receives an input prior to a second of the flip-flops if it is determined that the first scan chain is to operate in the normal mode; and
providing inputs to the flip-flops such that the first of the flip-flops receives an input subsequent to the second of the flip-flops if it is determined that the first scan chain is to operate in the rotate mode.

2. The method of claim 1, wherein the first scan chain comprises multiple segments of flip-flops, the first and second flip-flops corresponding to a first of the segments; and
wherein determining whether the first scan chain is to be operated in either a normal mode or a rotate mode comprises:
determining whether the first segment is to be operated in either a normal mode or a rotate mode and whether a second of the segments is to be operated in either a normal mode or a rotate mode.

3. The method of claim 1, wherein, in providing inputs to the flip-flops such that the first of the flip-flops receives an input subsequent to the second of the flip-flops, the first scan chain is folded into multiple segments that receive inputs in parallel.

4. The method of claim 1, further comprising:
providing a second scan chain of flip-flops operative to receive scan input data in parallel with the first scan chain.

5. The method of claim 4, wherein, when the first scan chain is operated in the rotate mode, at least some of the flip-flops of the first and second scan chain that occupy corresponding data positions contain different data.

6. The method of claim 1, wherein the scan chains form part of an integrated circuit; and further comprising:
analyzing data adjacencies of scan chains of the integrated circuit.

7. The method of claim 6, further comprising:
applying test patterns to the integrated circuit based, at least in part, upon the data adjacencies.

8. A method for reconfiguring scan chains comprising:
providing an integrated circuit having a first scan chain and a second scan chain operative in parallel such that flip-flops of the first scan chain and the second scan chain that occupy corresponding data positions contain identical scan input data; and
selectively reconfiguring the second scan chain such that flip-flops of the first scan chain and the second scan chain that occupy corresponding data positions do not contain identical scan input data.

9. The method of claim 8, wherein, in selectively reconfiguring the second scan chain, a last of the flip-flops of the second scan chain receives scan input data prior to a first of the flip-flops of the second scan chain such that last of the flip-flops of the second scan chain receives scan input data identical to scan input data received by a first of the flip-flops of the first scan chain.

10. A system for reconfiguring a scan chain, comprising:
a first scan chain of flip-flops operative in either a normal mode or a rotate mode such that, if the first scan chain is operative in the normal mode, inputs are provided to the flip-flops in sequential order with a first of the flip-flops receiving an input prior to a second of the flip-flops, and, if the first scan chain is operative in the rotate mode, inputs are provided to the flip-flops with the first of the flip-flops receiving an input subsequent to the second of the flip-flops.

11. The system of claim 10, further comprising:
means for determining whether the first scan chain is to be operated in either the normal mode or the rotate mode.

12. The system of claim 10, further comprising:
an integrated circuit, wherein the first scan chain is a portion of the integrated circuit.

* * * * *